(12) United States Patent
Keeth et al.

(10) Patent No.: US 6,445,636 B1
(45) Date of Patent: Sep. 3, 2002

(54) METHOD AND SYSTEM FOR HIDING REFRESHES IN A DYNAMIC RANDOM ACCESS MEMORY

(75) Inventors: Brent Keeth; Brian M. Shirley, both of Boise; Kevin J. Ryan, Eagle, all of ID (US); Charles H. Dennison, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/641,881

(22) Filed: Aug. 17, 2000

(51) Int. Cl.[7] .............................. G11C 7/00; G11C 8/00
(52) U.S. Cl. ................... 365/222; 365/230.03
(58) Field of Search ........................ 365/222, 230.03, 365/200, 233

(56) References Cited

U.S. PATENT DOCUMENTS

| | | | | |
|---|---|---|---|---|
| 5,442,588 A | * | 8/1995 | Runas | 365/222 |
| 5,483,497 A | * | 1/1996 | Mochizuki et al. | 365/222 |
| 5,818,777 A | * | 10/1998 | Seyyedy | 365/222 |
| 5,835,401 A | * | 11/1998 | Green et al. | 365/222 |
| 5,999,474 A | * | 12/1999 | Leung et al. | 365/222 |
| 5,999,481 A | * | 12/1999 | Cowles et al. | 365/222 |
| 6,185,136 B1 | * | 2/2001 | Shirley | 365/200 |
| 6,233,192 B1 | * | 5/2001 | Tanaka | 365/222 |
| 6,282,606 B1 | * | 8/2001 | Holland et al. | 365/222 |

\* cited by examiner

*Primary Examiner*—Trong Phan
(74) *Attorney, Agent, or Firm*—Dorsey & Whitney LLP

(57) ABSTRACT

A method and system for refreshing a dynamic random access memory ("DRAM") includes a pair of memory arrays for each of a plurality of banks. The DRAM includes the usual addressing and data path circuitry, as well as a refresh controller that refreshes the arrays in a manner that hides refreshes sufficiently that the DRAM can be used in place of an SRAM as a cache memory. Since only one of the arrays in each bank is refreshed at a time, the refresh controller is able to allow data to be written to the array that is not being refreshed. The refresh controller then causes the write data to be temporarily stored so that it can be written to the array of the refresh of the array has been completed. If neither array is being refreshed, the data are written to both arrays. Data are read from the arrays by first checking to determine if any of the arrays is being refreshed. If so, data are read from the array that is not being refreshed.

50 Claims, 4 Drawing Sheets

METHOD AND SYSTEM FOR HIDING REFRESHES IN A DYNAMIC RANDOM ACCESS MEMORY

TECHNICAL FIELD

The present invention relates to dynamic random access memories, and more particularly to a method and system for hiding the refresh of such memories thereby allowing such memories to be accessed at any time.

BACKGROUND OF THE INVENTION

Dynamic random access memories ("DRAMs") are commonly used as the system memory in computer systems. The DRAMs are typically coupled to a central processing unit ("CPU") through a DRAM controller or bus bridge which is, in turn, coupled to the CPU through a processor bus. The DRAMs include one or more memory arrays each having a large number of memory cells arranged in rows and columns. Each memory cell of the DRAM requires only a single transistor and capacitor, thus making DRAMs very compact. The compact nature of DRAMs makes it possible for them to provide high memory capacities at relatively little cost.

Although DRAMs have the advantage of providing relatively high memory capacities at relatively little cost, they have the disadvantage of requiring periodic refresh of their memory cells. More particularly, since memory cells store data by charging their respective memory cell capacitors to predetermined voltages, their capacitors must be recharged or "refreshed" before excessive charge has leaked from the capacitors. During the time that the memory cells are being refreshed, data generally cannot be written to either the row of memory cells being refreshed or any other memory cells in the array. Further, although data may be read from a row of memory cells being refreshed, data generally cannot be read from other memory cells in the array. For many applications of DRAMs, such as for use as system memory, the need to periodically refresh the memory cells does not significantly limit their usefulness. However, the need to periodically refresh DRAMs generally makes them unsuitable for other applications, as described below.

Computer systems using DRAMs for system memory also frequently use a cache memory, which is normally coupled directly to the processor bus. The cache memory allows the CPU to more quickly access frequently or recently used instructions and data. Cache memories are generally implemented using static random access memories ("SRAMs") that also have at least one array of memory cells. Each memory cell in the array is generally implemented by a pair of cross-coupled transistors, and each cell is accessed through a pair of access transistors. Each SRAM memory cell thus generally contains at least 4 transistors. As a result, SRAMs are far less compact than DRAMs and therefore significantly more expensive. However, SRAMs have a significant advantage over DRAMs in that their memory cells do not need to be periodically refreshed. As a result, SRAMs can be accessed by the CPU or other device at any time. In contrast, it would sometimes be necessary for the CPU or other device accessing a DRAM cache memory to wait until a refresh has been completed before the cache memory could be accessed. Therefore, despite their significantly higher expense, SRAM's are generally considered more suitable than DRAMs for use as cache memory.

It would be desirable to use DRAMs for cache memory so that high capacity cache memory could be provided at relatively little cost. Attempts have been made to use DRAMs for cache memory, but these attempts have generally proven unsuccessful because of the inability to access them during periodic refreshes. For example, attempts have been made to implement cache memory using a high capacity DRAM and a significantly smaller SRAM to temporarily store write data during a refresh of the DRAM when the data cannot be written to the DRAM. While these attempts have been able to "hide" refreshes of cache DRAMs under some circumstances, they have been unable to hide refreshes of DRAMs under at least some circumstances for a variety of reasons. Thus, these prior art cache DRAMs constrained computer systems using them in various ways, and their use often required that the computer system be specially modified for use with such cache DRAMs.

It would therefor be desirable to provide cache DRAMs that could truly hide the periodic refresh of their memory cells and which did not require special modifications of computer system, thus allowing such DRAMs to be pin compatible with cache SRAMS.

SUMMARY OF THE INVENTION

A dynamic random access memory ("DRAM"), includes first and second arrays of memory cells each containing substantially the same data. A refresh circuit is structured to refresh the memory cells in either the first array or the second array, but not both. The refresh circuit is also structured to control access to one of the arrays as a function of which if any of the arrays is being refreshed. For a write access, the refresh circuit determines if either of the arrays is being refreshed. If one of the arrays is being refreshed, the refresh circuit allows data to be written to the array that is not being refreshed. The write data are also buffered until the refresh is completed, and are then written to the array that was being refreshed. Alternatively, the data can be later read from the array to which it was written and then written to the array that was being refreshed. If neither of the arrays is being refreshed, the refresh circuit allows data to be written to both arrays simultaneously. In either case, the refresh circuit also retains an indication of to which array(s) the data have been written, such as by setting a flag in a register. For a read access, the refresh circuit determines if either or both of the arrays contain valid data at locations corresponding to an address from which the data are to be read. The refresh circuit then allows data to be read from at least one of the arrays containing valid data. Since the refreshes are substantially hidden, the DRAM can be advantageously used as a cache memory in a computer system.

DETAILED DESCRIPTION OF THE INVENTION

The following is a description of a DRAM and method that may be accessed during refreshes of the memory cells in the DRAM. In this description, certain details are set forth in order to provide a thorough understanding of various embodiments of the present invention. It will be clear to one skilled in the art, however, that the present invention may be practiced without these details. In other instances, well-known circuits, circuit components, and control signals and associated timing protocols have not been shown or described in detail in order to avoid unnecessarily obscuring the description of the various embodiments of the invention.

Figure 1:
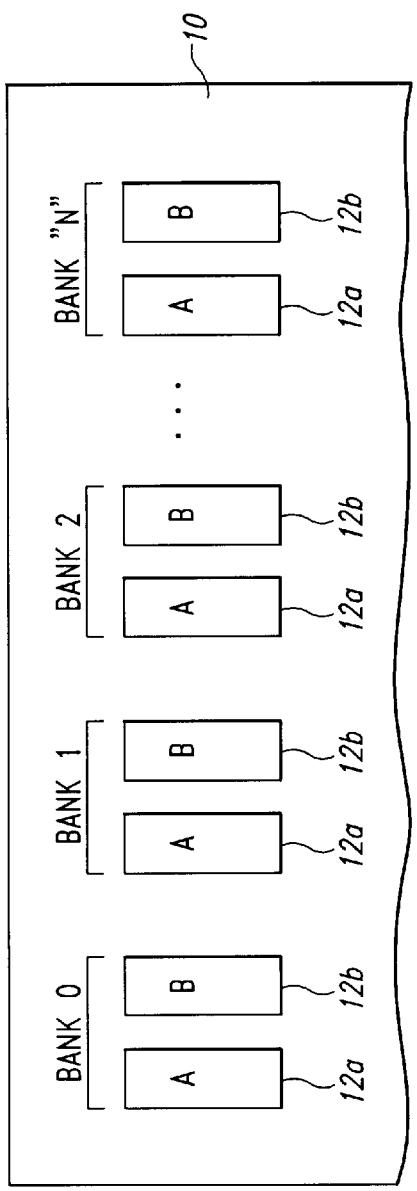
FIG. 1 is a schematic top plan view of a semiconductor wafer showing the layout of a plurality of arrays of a memory device.

The preferred embodiment of the invention is a DRAM formed on a semiconductor die 10, as illustrated in FIG. 1. The semiconductor die 10 contains a plurality of memory banks, BANK 0, BANK 1, BANK 2 . . . BANK N. Each memory bank contains two memory arrays 12a,b having the same size and storing the same data bits. Thus, two memory cells exist for each memory address. As a result, if one memory array 12a is being refreshed, a memory access to the DRAM can occur in the other memory array 12b. Although the layout of memory arrays 12a,b shown in FIG. 1 is preferred, it will be understood that the memory arrays 12a,b may be laid out in other arrangements.

Figure 2:
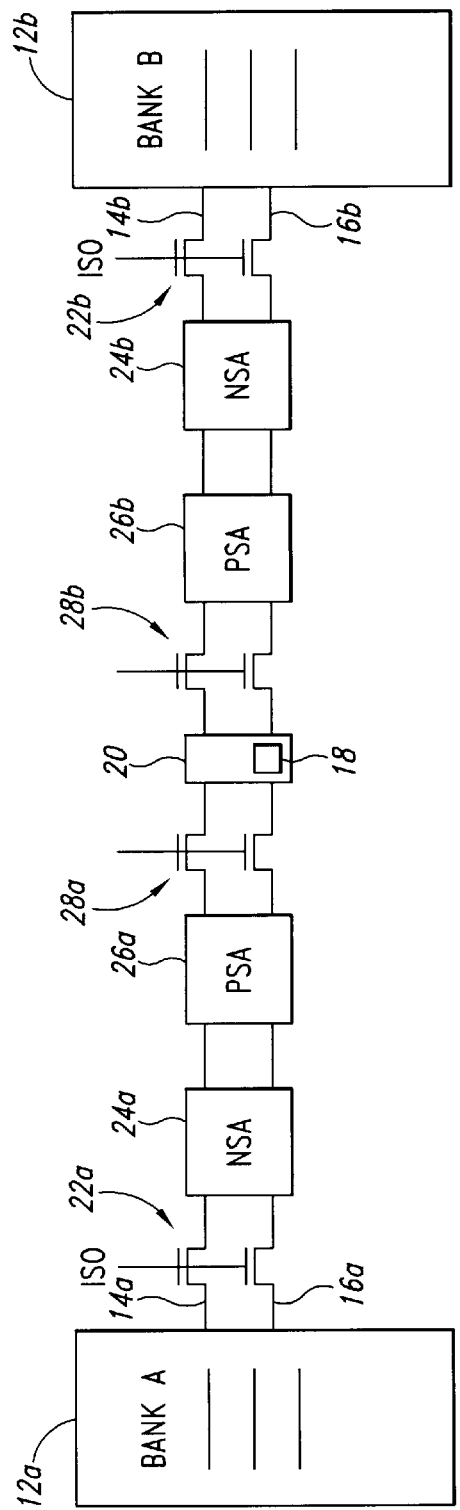
FIG. 2 is a block diagram and schematic showing a portion of the circuitry that may be used to access the memory arrays shown in FIG. 1.

The manner in which access to corresponding memory cells in the arrays 12a,b will now be explained with reference to FIG. 2. As is well known in the art, each array 12a,b contains a large number of memory cells (not shown) arranged in rows and columns. A row line (not shown) is provided for each row of memory cells which, when active, allows access to all of the memory cells in the row. A particular memory cell in the accessed row is accessed by coupling a data bit to or from the memory cell through a pair of complimentary digit lines, one pair of which 14a,b and 16a,b is shown in FIG. 2. The digit lines 14a,b couple data to or from one column of the respective arrays 12a,b, and the digit lines 16a,b couple the compliment of the data to or from the same column of the arrays 12a,b. The digit lines for the other columns of the arrays 12a,b have been omitted in the interest of clarity and brevity.

As shown in FIG. 2, the digit lines 14a,b and 16a,b are coupled to common I/O circuitry 20 through a respective set of isolation transistors 22a,b, negative sense amps ("NSA") 24a,b, positive sense amps ("PSA") 26a,b and a respective set of transfer gate transistors 28a,b.The operation of the isolation transistors 22a,b and the sense amps 24, 26 is conventional, and a complete explanation of them will therefore be omitted in the interest of brevity. During a write memory access, data is coupled through a data path (not shown) to the I/O circuitry 20. Either or both of the sets of transfer gate transistors 28a,b are turned ON to couple the data to memory cells in an addressed column of an addressed row in either or both of the arrays 12a,b. If the set of transfer gate transistors 28a are turned ON, data is written to the memory array 12a. If the set of transfer gate transistors 28b are turned ON, data is written to the memory array 12b. If both sets of transfer gate transistors 28a,b are turned ON, data is written to both memory arrays 12a,b. The I/O 20 circuit preferably contains a write buffer 18 that is capable of storing a row of write data. If one of the arrays 12a,b is being refreshed during a write access to the array, the data are temporarily stored in the write buffer 18 of the I/O circuit 20. After the refresh has been completed, the write data are transferred from the write buffer 18 to the array 12a,b that was being refreshed. Alternatively, data may be transferred from the array 12a,b to which it was written to the other array 12b,a at a later time after the refresh has been completed. For a read access, one of the arrays, e.g., array 12a, can be considered a primary array from which the data will be read if the array 12a is not being refreshed. If the array 12a is being refreshed, then data can be read from the array 12b, which is then considered to be a secondary array. Alternatively, each of the arrays 12a,b can alternatively be considered a primary array, with the other array being considered a secondary array. For example, the array 12a may be considered the primary array and the array 12b may be considered the secondary array for a period of 64 ms, which is the duration of a typical refresh period. For the next 64 ms, the array 12b may be considered the primary array and the array 12a may be considered the secondary array, and so forth. In either case, data will be read from the primary array if the primary array is not being refreshed. If the primary array is being refreshed, the data are read from the secondary array. The transfer gate transistors 28a,b are preferably operated by a refresh controller (not shown), which will be explained with reference to FIGS. 3 and 4.

During a read operation, the sense amplifiers 24a,b and 26a,b develop a complimentary voltage across the digit lines 14,16 corresponding to the data being read from an addressed column in an addressed row of the memory arrays 12a,b. One of the sets of transfer gate transistors 28a,b are turned ON to couple the complimentary voltage to the I/O circuitry 20, and it is then coupled from the I/O circuitry through the data path. If the set of transfer gate transistors 28a are turned ON, data is read from the memory array 12a. If the set of transfer gate transistors 28b are turned ON, data is read from the memory array 12b. Although data are not simultaneously read from both memory arrays 12a,b, both transfer gate transistors 28a,b may be turned ON to perform a write to one array 12a,b following a read from the other array 12b,a. More specifically, for example, the transfer gate transistors 28a may be turned ON to read data from the memory array 12a. Then, after the voltage corresponding to the read data has been developed across the digit lines 14a and 16a, the transfer gate transistors 28b may be turned ON to write the data being read from the memory array 12a to the memory array 12b.

Although the embodiment of FIG. 2 includes transfer gate transistors 28a,b specifically provided for coupling data to or from the memory arrays 12a,b, it will be understood that the transistors 28a,b may also be part of column addressing circuitry. If so, the transistors 28a,b are turned ON based on a column address as well as which array 12a,b is to be accessed. Other circuitry for controlling access to either of the arrays 12a,b may, of course, also be used.

Figure 3:
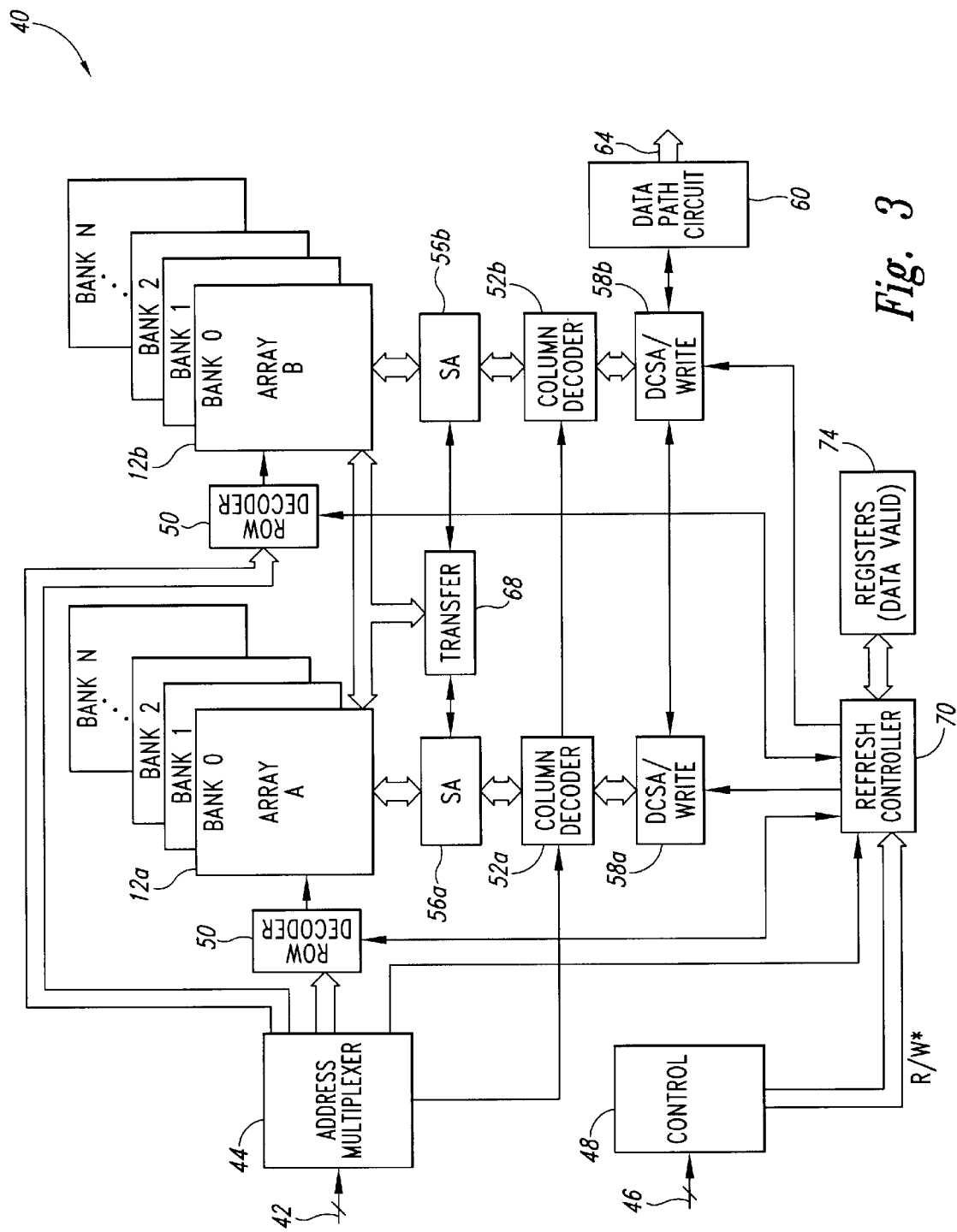
FIG. 3 is a block diagram of the memory device shown in FIG. 1.

One embodiment of a DRAM 40 having a hidden refresh is shown in FIG. 3. As in the DRAM of FIG. 1, the DRAM 40 includes N memory banks each having two arrays 12a,b. Row and column addresses for accessing data in the arrays 12a,b are applied through an address bus 42 to an address multiplexer 44, and command signals are applied through a control bus 46 to a control circuit 48 that includes an internal command decoder (not shown). The control circuit 48 generates a variety of control signals for controlling the operation of the DRAM 40, some of which are discussed below. The address multiplexer 44 couples row addresses to a row decoder 50 and column addresses to respective column decoders 52a,b for the arrays 12a,b. The DRAM 40 also includes respective sense amplifiers 56a,b like the negative and positive sense amplifiers 24, 26 shown in FIG. 2, and respective D.C. sense amplifiers ("DCSA") and write drivers ("WRITE") 58a,b ("DCSA/WRITE"). The DC sense amplifiers 58a,b couple read data from the respective sense amplifiers 56a,b to a data path circuit 60. The data path circuit 60, in turn, couples the read data to a data bus 64. Write data is coupled from the data bus 64 to the write drivers 58a,b through the data path circuit 60. The write drivers 58a,b, in turn, couple that data to complimentary pairs of digit lines (not shown in FIG. 3) as determined by the column address. The structure and operation of D.C. sense amplifiers, write drivers, and data path circuits of the type that may be used in the embodiment of FIG. 3 are conventional.

The DRAM 40 also includes a set of transfer circuits 68, which may be implemented using the transfer gate transistors 28 shown in the embodiment of FIG. 2. The transfer circuit 68 allow data to be transferred from a column of one array 12a,b to the corresponding column of the other array 12b,a, as explained above with reference to FIG. 2.

As mentioned earlier, the memory cells in the memory arrays 12a,b must be periodically refreshed to avoid a loss of data. A refresh controller 70 is provided for this purpose. As in a conventional refresh controller, the refresh controller 70 ensures that each row of memory cells in each array 12a,b is refreshed at a rate sufficient to prevent a loss of data. However, the refresh controller 70 is capable of individually refreshing either memory array 12a,b, although it preferably does not refresh both memory arrays 12a,b at the same time. As explained in detail below, the operation of the refresh controller 70 is a function of whether a memory access is either a write or a read, and thus receives control signals from the control circuit 48, including a read/write* ("R/ W*") signal . The refresh controller 70 also interfaces with a data valid register 74 that, as explained in detail below, provides an indication of whether the data in each row of the arrays 12a,b are valid. The register 74 receives row addresses from the address multiplexer 44 via the refresh controller 70 so that, as each row of the memory arrays 12a,b is addressed, the register 74 can provide an indication of whether the data in the addressed row of each array 12a,b is valid.

The operation of the refresh controller 70 in conjunction with the operation of the DRAM 40 will now be explained with reference to a flow chart 80, which is shown in FIG. 4. Based on the flow chart 80 and a knowledge of conventional refresh controller circuitry, the refresh controller 70 used in the embodiment of FIG. 3 can be easily implement by one skilled in the art using either a properly programmed microprocessor (not shown) or hard-wired logic circuitry (not shown). It should be noted, however, that a large number of operating steps of the DRAM 40 have been omitted from the flow chart 80 and the following explanation because they are conventional and somewhat peripheral to the inventive concepts described herein.

Figure 4A:
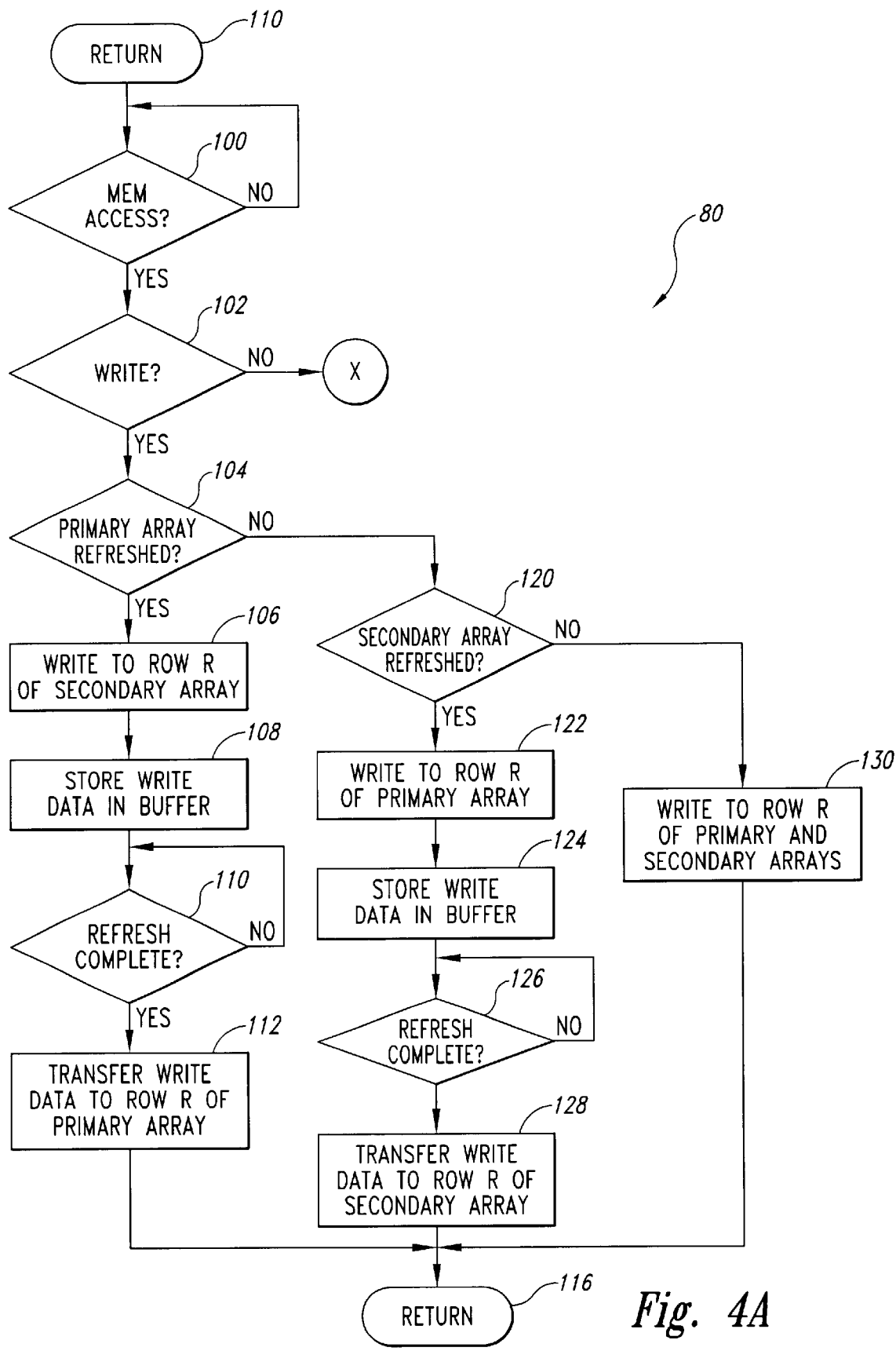
FIGS. 4A–4B is a flow chart showing the operation of a refresh controller used in the memory device of FIG. 3.
Figure 4B:
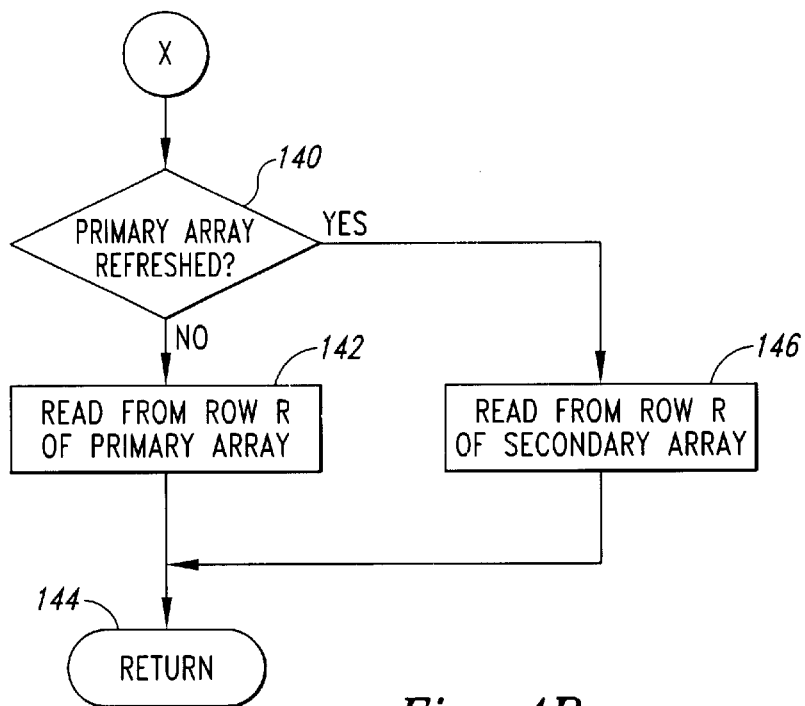

With reference to FIGS. 4A–4B the process is entered at 100 with the refresh controller 70 detecting a memory access request from a CPU (not shown in FIG. 3) or other memory access device. The control circuit 48 (FIG. 3) applies suitable control signals to the refresh controller 70 to allow the refresh controller 70 to make this determination. The refresh controller 70 then checks the status of the R/W* signal (FIG. 3) at 102 to determine if the memory access request is for a "Write" memory access. If a "Write" request is detected, the refresh controller 70 determines at 104 if the primary array is currently being refreshed. As explained above, either of the arrays 12a,b can be used as the primary array, or the array that is used as the primary array can either alternate between the arrays 12a,b. The refresh controller 70 is able to determine if either of the arrays 12a,b is being refreshed without any external inputs because the refresh controller 70 itself causes the arrays 12a,b to be periodically refreshed. If it is determined at 104 that the primary array is being refreshed, then, at 106, the write data is written to Row R of the secondary array, where R is the row address applied to the address multiplexer 44. As also explained above, either of the arrays 12a,b can be used as the primary array, or the array that is used as the primary array can either alternate between the arrays 12a,b. (It is assumed herein that memory accesses are to an entire row of data in the arrays 12a,b). The writing of data to the secondary array in this manner is carried out by circuitry other than the refresh controller 70, as explained above. However, as also explained above, the refresh controller 70 selects either the primary array or the secondary array for the memory access by suitable means, such as by controlling the transfer gate transistors 28a,b shown in FIG. 2. At 108, the write data is stored in the write buffer 18, which, as explained above, is internal to the I/O circuitry 20 (FIG. 2). The refresh controller 70 then waits in a loop at 110 for the refresh of the primary array to be completed before proceeding to 112 where the data stored in the write buffer 18 are transferred to Row R of the primary array. As a result, data can be written to the DRAM 40 without the need for a CPU or other memory access device to wait for the refresh to be completed. The process then returns to the entry point 100 via step 116.

If the refresh controller 70 determines at 104 that the primary array is not being refreshed, then it checks at 120 to determine if the secondary array is being refreshed. If so, the write data is written to Row R of the primary array at step 122, thereby allowing the refresh of the secondary array to continue. The write data is then stored in the write buffer 18 of the I/O circuitry 20 at 124. The refresh controller 70 then waits in a loop at 126 for the refresh of the secondary array to be completed before proceeding to 128 where the data stored in the write buffer 18 are transferred to Row R of the secondary array. The process then again returns to 100 via 116.

If the refresh controller 70 determines at 104 that the primary array is not being refreshed and it determines at 120 that the secondary array is not being refreshed, then the write data can be written to both arrays 12a,b. Accordingly, the write data is written to Row R of both the primary array and the secondary array 12b at 130 before returning to 100 via 116.

If, after detecting a memory access request at 100, the refresh controller 70 does not detect a "Write" memory access request at 102, then it concludes the request must be for a "Read" memory access request and proceeds to step 140. At 140, the refresh controller 70 determines if the primary array is being refreshed. If not, the refresh controller 70 causes data to be read from Row R of the primary array at step 142. The process then returns to step 100 via 144 If the refresh controller 70 determines at 140 that the primary array is not being refreshed, it causes data to be read from Row R of the secondary array at step 146 before returning via 144. The refresh controller 70 is able to select either the primary array or the secondary array for the memory access by suitable means, such as by controlling the transfer gate transistors 28a,b (FIG. 2) so that the data are read from the primary array rather than the secondary array or vice-versa.

Figure 5:
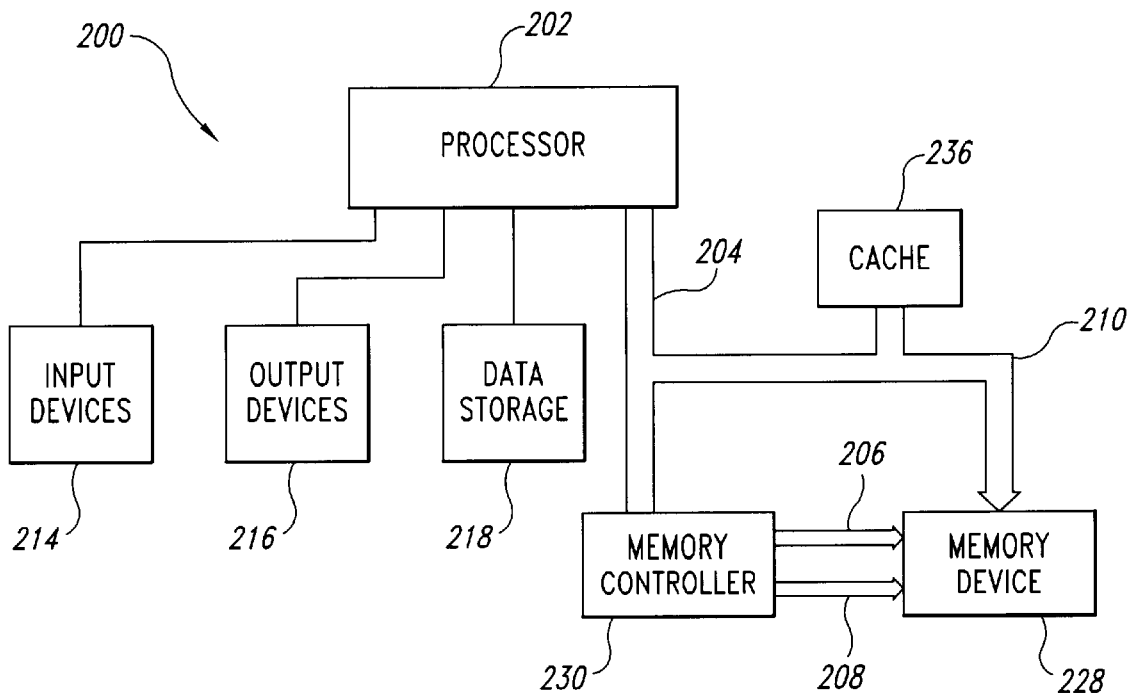
FIG. 5 is a block diagram of a computer system containing the memory device of FIGS. 3 and 4.

The DRAM 40 described with reference to FIGS. 3 and 4 can be advantageously used in a computer system, such as a computer system 200 shown in FIG. 5. The computer system 200 includes a processor 202 for performing various computing functions, such as executing specific software to perform specific calculations or tasks. The processor 202 includes a processor bus 204 that normally includes an address bus 206, a control bus 208, and a data bus 210. In addition, the computer system 200 includes one or more input devices 214, such as a keyboard or a mouse, to allow an operator to interface with the computer system 200.

Typically, the computer system 200 also includes one or more output devices 216 coupled to the processor 202, such output devices typically being a printer or a video terminal. One or more data storage devices 218 are also typically coupled to the processor 202 to store data or retrieve data from external storage media (not shown). Examples of typical storage devices 218 include hard and floppy disks, tape cassettes, and compact disk read-only memories ("CD-ROMs"). The processor 202 is also typically coupled to system memory 228 through a memory controller 230. The system memory 228 is typically composed of dynamic random access memories ("DRAMs"). Finally, the computer system 200 includes a cache memory 236 that is coupled to the processor 202 through the processor bus 204. As explained above, the cache memory 236 is usually static random access memory ("SRAM"), and it is provided for the purpose of allowing the processor 202 to more quickly read frequently or recently accessed data or instructions. However, unlike conventional computer systems, the cache memory 236 used in the computer system 200 of FIG. 5 is a DRAM having hidden of the type shown in FIGS. 3 and 4. Even though the cache memory 236 requires twice as many memory cells as a conventional DRAM of the same capacity, it nevertheless uses about half the number of transistors as a conventional SRAM of the same capacity. Thus, the cache memory 236 is able to provide a relatively high capacity at relatively little cost compared to an SRAM used as the cache memory 236.

It will be appreciated that, although specific embodiments of the present invention have been described above for purposes of illustration, various modifications may be made without deviating from the spirit and scope of the invention. For example, although the DRAM 40 is shown in FIG. 4 in somewhat basic form, it will be understood that the DRAM 40 may assume a variety of DRAM configurations, including synchronous DRAMs ("SDRAMs"), Rambus DRAMs ("RDRAMs") and Synchronous Link DRAMs, ("SLDRAMs"). Further, although FIG. 5 shows the DRAM 40 being accessed by a processor 202, it will be understood that other access devices, such as graphics processors and other direct memory access ("DMA") devices, may also be used. Accordingly, the invention is not limited by the disclosed embodiments, but instead the scope of the invention is determined by the following claims.

What is claimed is:

1. A dynamic random access memory ("DRAM"), comprising:
    a first array of memory cells;
    a second array of memory cells;
    an address circuit to receive an address and being structured to access locations in the first and second arrays corresponding to the address;
    a data path circuit structured to couple data between a data terminal and the first and second arrays;
    a control circuit to receive memory commands and being structured to generate control signals corresponding to the memory commands to access the first and second arrays; and
    a refresh circuit coupled to the control circuit and the first and second arrays, the refresh circuit being structured to refresh the memory cells in either the first array or the second array, the refresh circuit being structured to cause write data to be temporarily stored in a write buffer responsive to a write memory access when either the first or second arrays is being refreshed, to determine when the refresh is completed, and to transfer the data from the write buffer to the array that was being refreshed after the refresh has been completed.

2. The DRAM of claim 1 wherein the control circuit is structured to generate a first set of control signals responsive to a write memory access and a second set of control signals responsive to a read memory access, and wherein the refresh circuit is structured to respond to the first set of control signals by determining if either of the first and second arrays is being refreshed, and, if one of the first and second arrays is being refreshed, allowing data to be written to the one of the first and second arrays that is not being refreshed.

3. The DRAM of claim 1 wherein the control circuit is structured to generate a first set of control signals responsive to a write memory access and a second set of control signals responsive to a read memory access, and wherein the refresh circuit is structured to respond to the first set of control signals by determining if either of the first and second arrays is being refreshed, and, if neither of the first and second arrays is being refreshed, allowing data to be written to both of the first and second arrays.

4. The DRAM of claim 1 wherein the control circuit is structured to generate a first set of control signals responsive to a write memory access and a second set of control signals responsive to a read memory access, and wherein the refresh circuit is structured to respond to the second set of control signals by determining if either of the arrays is being refreshed, and, if so, allowing data to be read from the array that is not being refreshed.

5. The DRAM of claim 1 wherein the control circuit is structured to generate a first set of control signals responsive to a write memory access and a second set of control signals responsive to a read memory access, and wherein the refresh circuit is structured to respond to the second set of control signals by determining if either of the arrays is being refreshed and, if neither of the arrays is being refreshed, allowing data to be read from a primary one of the arrays.

6. The DRAM of claim 5 wherein the array that is used as the primary one of the arrays periodically alternates between a plurality of the arrays.

7. The DRAM of claim 1 wherein the first and second arrays each contain a plurality of digit line pairs having locations corresponding to at least part of the address, and wherein each of the digit lines pairs in the first array is coupled through a transfer circuit to a digit line pair in the second array having a corresponding location, and wherein the refresh circuit is structured to write the data to the arrays by opening the transfer circuit between the digit line pair corresponding to the address.

8. The DRAM of claim 1 wherein the refresh circuit comprises a refresh controller coupled to the control circuit and the first and second arrays, the refresh controller being structured to refresh the memory cells in either the first array or the second array, the refresh controller being structured to control access to one of the first and second arrays as a function of whether the first array is being refreshed and whether the second array is being refreshed.

9. The DRAM of claim 1 wherein the DRAM comprises an SDRAM.

10. The DRAM of claim 1 wherein the DRAM comprises an RDRAM.

11. The DRAM of claim 1 wherein the DRAM comprises an SLDRAM.

12. The DRAM of claim 1 wherein the first and second arrays are included in each of a plurality of memory bank so that each of the memory banks contain a respective pair of the first and second arrays.

13. The DRAM of claim 12 wherein the DRAM is fabricated on a semiconductor wafer, and wherein the memory banks are laid out on the wafer in respective discrete areas so that each of the discrete areas contains a respective pair of the first and second arrays.

14. A dynamic random access memory ("DRAM"), comprising:
   a first array of memory cells, the first array storing data;
   a second array of memory cells, the second array containing substantially the same data as the data stored in the first array;
   an address circuit to receive an address and being structured to access locations in the first and second arrays corresponding to the address;
   a data path circuit structured to couple data between a data terminal and the first and second arrays;
   a control circuit; and
   a refresh circuit coupled to the control circuit and the first and second arrays, the refresh circuit being structured to refresh the memory cells in either the first array or the second array, the refresh circuit being structured to permit data to be written to the first array when the second array is being refreshed and to permit data to be written to the second array when the first array is being refreshed.

15. The DRAM of claim 14 wherein the refresh circuit is structured to cause write data to be temporarily stored in a write buffer responsive to a write memory access when either the first or second arrays is being refreshed, to determine when the refresh is completed, and to transfer the data from the write buffer to the array that was being refreshed after the refresh has been completed.

16. The DRAM of claim 14 wherein the refresh circuit is structured to determining if either of the first and second arrays is being refreshed, and, if so, permitting data to be written to both of the first and second arrays.

17. The DRAM of claim 14 wherein the refresh circuit comprises a refresh controller coupled to the control circuit and the first and second arrays, the refresh controller being structured to refresh the memory cells in either the first array or the second array, the refresh controller being structured to permit data to be written to the first array when the second array is being refreshed and to permit data to be written to the second array when the first array is being refreshed.

18. The DRAM of claim 14 wherein the DRAM comprises an SDRAM.

19. The DRAM of claim 14 wherein the first and second arrays are included in each of a plurality of memory bank so that each of the memory banks coritain a respective pair of the first and second arrays.

20. The DRAM of claim 19 wherein the DRAM is fabricated on a semiconductor wafer, and wherein the memory banks are laid out on the wafer in respective discrete areas so that each of the discrete areas contains a respective pair of the first and second arrays.

21. A refresh circuit for a dynamic random access memory ("DRAM") having first and second arrays of memory cells, the refresh circuit, comprising:
   a refresh controller being structured to refresh the memory cells in either the first array or the second array, the refresh controller being structured to control access to one of the first and second arrays as a function of either whether the first array is being refreshed and whether the second array is being refreshed; and
   a data valid register coupled to the refresh controller, the data valid register being structured to retain an indication of whether data stored in predetermined locations in the first and second arrays are valid.

22. The refresh circuit of claim 21 wherein the refresh controller is structured to respond to a write memory access by determining if either of the first and second arrays is being refreshed, and, if one of the first and second arrays is being refreshed, allowing data to be written to the one of the first and second arrays that is not being refreshed.

23. The refresh circuit of claim 21 wherein the refresh controller is structured to cause write data to be temporarily stored in a write buffer, determine when the refresh is completed and then transfer write data from the write buffer to the array that was being refreshed after he refresh has been completed.

24. The refresh circuit of claim 21 wherein the refresh controller is structured to respond to a write memory access by determining if either of the first and second arrays is being refreshed, and, if neither of the first and second arrays is being refreshed, allowing data to be written to both of the first and second arrays.

25. The refresh circuit of claim 21 wherein the refresh controller is structured to respond to a read memory access by determining if either of the arrays is being refreshed, and, if so, allowing data to be read from the array that is not being refreshed.

26. The refresh circuit of claim 25 wherein the control circuit is structured to generate a first set of control signals responsive to a write memory access and a second set of control signals responsive to a read memory access, and wherein the refresh circuit is structured to respond to the second set of control signals by determining if either of the arrays is being refreshed, and, if neither of the arrays is being refreshed, allowing data to be read from a primary one of the arrays.

27. The refresh circuit of claim 26 wherein the array that is used as the primary one of the arrays periodically alternates between a plurality of the arrays.

28. The refresh circuit of claim 21 wherein the refresh controller is structured to respond to a read memory access by determining if either of the first and second arrays are being refreshed, and, if either of the first and second arrays are being refreshed, allowing data to be read from the one of the first and second arrays that is not being refreshed.

29. A computer system, comprising:
   a processor coupled to a processor bus;
   a memory controller coupled to the processor bus;
   a system memory coupled to memory controller for allowing memory accesses by the processor;
   a data input device coupled to the processor;
   a data output device coupled to the processor; and
   a cache memory coupled to the processor through the processor bus, the cache memory being a dynamic random access memory ("DRAM") comprising:
      a first array of memory cells;
      a second array of memory cells;
      an address circuit to receive an address and being structured to access locations in the first and second arrays corresponding to the address;
      a data path circuit structured to couple data between a data terminal and the first and second arrays;
      a control circuit to receive memory commands and being structured to generate control signals corresponding to the memory commands to access the first and second arrays; and
      a refresh circuit coupled to the control circuit and the first and second arrays, the refresh circuit being structured to refresh the memory cells in either the first array or the second array, the refresh circuit being structured to cause write data to be temporarily stored in a write buffer responsive to a write memory access when either the first or second arrays is being refreshed, to determine when the refresh is completed, and to transfer the data from the write buffer to the array that was being refreshed after the refresh has been completed.

30. The computer system of claim 29 wherein the control circuit is structured to generate a first set of control signals responsive to a write memory access and a second set of control signals responsive to a read memory access, and where in the refresh circuit is structured to respond to the first set of control signals by determining if either of the first and second array being refreshed, and, if one of the first and second arrays is being refreshed, allowing data to be written to the one of the first and second arrays that is not being refreshed.

31. The computer system of claim 29 wherein the control circuit is structured to generate a first set of control signals responsive to a write memory access and a second set of control signals responsive to a read memory access, and wherein the refresh circuit is structured to respond to the first set of control signals by determining if either of the first and second arrays is being refreshed, and, if neither of the first and second arrays is being refreshed, allowing data to be written to both of the first and second arrays.

32. The computer system of claim 29 wherein the control circuit is structured to generate a first set of control signals responsive to a write memory access and a second set of control signals responsive to a read memory access, and wherein the refresh circuit is structured to respond to the second set of control signals by determining if either of the arrays is being refreshed, and, if neither of the arrays is being refreshed, allowing data to be read from a primary one of the arrays.

33. The computer system of claim 32 wherein the array that is used as the primary one of the arrays periodically alternates between a plurality of the arrays.

34. The computer system of claim 32 wherein the first and second arrays each contain a plurality of digit line pairs having locations corresponding to at least part of the address, and wherein each of the digit lines pairs in the first array is coupled through a transfer gate to a digit line pair in the second array having a corresponding location and wherein the refresh circuit is structured to write the data to the arrays by opening the transfer gate between the digit line pair corresponding to the address.

35. The computer system of claim 29 wherein the control circuit is structured to generate a first set of control signals responsive to a write memory access and a second set of control signals responsive to a read memory access, and wherein the refresh circuit is structured to respond to the second set of control signals by determining if either of the first and second arrays are being refreshed, and, if either of the first and second arrays are being refreshed, allowing data to be read from the one of the first and second arrays that is not being refreshed.

36. The computer system of claim 29 wherein the refresh circuit comprises a refresh controller coupled to the control circuit and the first and second arrays, the refresh controller being structured to refresh the memory cells in either the first array or the second array, the refresh controller being structured to control access to one of the first and second arrays as a function of whether the first array is being refreshed and whether the second array is being refreshed.

37. The computer system of claim 29 wherein the DRAM comprises an SDRAM.

38. The computer system of claim 29 wherein the DRAM comprises an RDRAM.

39. The computer system of claim 29 wherein the DRAM comprises an SLDRAM.

40. The computer system of claim 29 wherein the first and second arrays are included in each of a plurality of memory bank so that each of the memory banks contain a respective pair of the first and second arrays.

41. The computer system of claim 40 wherein the DRAM is fabricated on a semiconductor wafer, and wherein the memory banks are laid out on the wafer in respective discrete areas so that each of the discrete areas contains a respective pair of the first and second arrays.

42. A method of refreshing a dynamic random access memory ("DRAM") while substantially hiding the refresh, the method comprising:

storing data in a first array of memory cells;

storing substantially the same data that is stored in the first array of memory cells in a second array of memory cells having substantially the same size as the first array;

refreshing the memory cells in either the first array or the second array, but not both arrays at the same time; and allowing memory accesses to one of the first and second arrays as a function of either whether the first array is being refreshed and whether the second array is being refreshed.

43. The method of claim 42 wherein the act of allowing memory accesses to one of the first and second arrays comprises determining if either of the first and second arrays is being refreshed; and if one of the first and second arrays is being refreshed, allowing data to be written to the one of the first and second arrays that is not being refreshed.

44. The method of claim 42 wherein the act of allowing memory accesses to one of the first and second arrays comprises:

determining if either of the first and second arrays is being refreshed; and if neither of the first and second arrays is being refreshed, allowing data to be written to both of the first and second arrays.

45. The method of claim 42 wherein the act of allowing memory accesses to one of the first and second arrays comprises determining if either of the arrays is being refreshed;

if either of the arrays is being refreshed, allowing data to be read from the array that is not being refreshed; and if neither of the arrays is being refreshed, allowing data to be read from one of the arrays.

46. The method of claim 42 wherein the array from which data is read if neither of the arrays is being refreshed periodically alternates between the arrays.

47. The method of claim 42 wherein the act of allowing memory accesses to one of the first and second arrays comprises determining if either of the first and second arrays are being refreshed, and if either or the first and second arrays are being refreshed, allowing data to be read from the one of the first and second arrays that is not being refreshed.

48. A method of refreshing a dynamic random access memory ("DRAM") while substantially hiding refresh, the method comprising:

storing data in a first array of memory cells;

storing substantially the same data that is stored in the first array of memory cells in a second array of memory cells having substantially the same size as the first array;

refreshing the memory cells in either the first array or the second array, but not both arrays at the same time;

permitting data to be written to the first array when the second array is being refreshed; and permitting data to be written to the second array when the first array is being refreshed.

49. The method of claim 48 further comprising:

determining if neither of the first and second arrays is being refreshed; and if neither of the first and second arrays is being refreshed, permitting data to be written to both of the first and second arrays.

50. The method of claim 50 further comprising:

determining if either of the first and second arrays is being refreshed;

permitting data be written to the array that is not being refreshed;

if either of the first and second arrays is being refreshed, temporarily storing the data that is to be written to the array that is being refreshed;

waiting until the refresh of the array has been completed; and after the refresh has been completed, permitting the data to be written to the array that was being refreshed.

* * * * *

UNITED STATES PATENT AND TRADEMARK OFFICE
CERTIFICATE OF CORRECTION

PATENT NO.    : 6,445,636 B1
DATED         : September 3, 2002
INVENTOR(S)   : Brent Keeth et al.

It is certified that error appears in the above-identified patent and that said Letters Patent is hereby corrected as shown below:

<u>Title page,</u>
Item [57], ABSTRACT,
Line 12, "of the array has been" should read -- of the array that has been --

<u>Column 1,</u>
Line 53, "at least 4 transistors." should read -- at least 4 transistors. --

<u>Column 2,</u>
Line 17, "modifications of" should read -- modifications of the --
Line 59, "FIGS. 4A-4B is a flow chart" should read -- FIGS. 4A-4B are flow charts --

<u>Column 3,</u>
Line 34, "couple the compliment" should read -- couple the complement --

<u>Column 4,</u>
Line 18, "develop a complimentary" should read -- develop a complementary --
Line 22, "couple the complimentary" should read -- couple the complementary --

<u>Column 5,</u>
Line 60, "can either alternate" should read -- can alternate --

<u>Column 7,</u>
Line 21, "having hidden of the type shown" should read -- having a hidden refresh of the type shown --

<u>Column 8,</u>
Line 42, "of the digit lines pairs" should read -- of the digit line pairs --
Line 63, "plurality of memory bank" should read -- plurality of memory banks --
Line 64, "memory banks contain" should read -- memory banks contains --

<u>Column 9,</u>
Line 47, "plurality of memory bank" should read -- plurality of memory banks --

<u>Column 10,</u>
Line 11, "after he refresh" should read -- after the refresh --

UNITED STATES PATENT AND TRADEMARK OFFICE
CERTIFICATE OF CORRECTION

PATENT NO. : 6,445,636 B1
DATED : September 3, 2002
INVENTOR(S) : Brent Keeth et al.

It is certified that error appears in the above-identified patent and that said Letters Patent is hereby corrected as shown below:

Column 11,
Line 42, "digit lines pairs" should read -- digit line pairs --

Column 12,
Line 7, "bank so that" should read -- banks so that --

Column 13,
Line 5, "hiding refresh" should read -- hiding the refresh --

Column 14,
Line 7, "method of claim 50further" should read -- method of claim 48 further --

Signed and Sealed this

Twelfth Day of August, 2003

JAMES E. ROGAN
*Director of the United States Patent and Trademark Office*